(12) United States Patent
Hess et al.

(10) Patent No.: US 8,178,876 B2
(45) Date of Patent: May 15, 2012

(54) METHOD AND CONFIGURATION FOR CONNECTING TEST STRUCTURES OR LINE ARRAYS FOR MONITORING INTEGRATED CIRCUIT MANUFACTURING

(75) Inventors: Christopher Hess, San Carlos, CA (US); David Goldman, Las Vegas, NV (US)

(73) Assignee: PDF Solutions, Inc., San Jose, CA (US)

( * ) Notice: Subject to any disclaimer, the term of this patent is extended or adjusted under 35 U.S.C. 154(b) by 1124 days.

(21) Appl. No.: 10/595,384

(22) PCT Filed: Apr. 30, 2004
(Under 37 CFR 1.47)

(86) PCT No.: PCT/US2004/013483
§ 371 (c)(1),
(2), (4) Date: Jun. 30, 2008

(87) PCT Pub. No.: WO2005/040961
PCT Pub. Date: May 6, 2005

(65) Prior Publication Data
US 2009/0037131 A1    Feb. 5, 2009

Related U.S. Application Data

(60) Provisional application No. 60/511,535, filed on Oct. 15, 2003.

(51) Int. Cl.
*H01L 23/58* (2006.01)
(52) U.S. Cl. ........... 257/48; 438/11; 438/14; 438/15; 438/18; 257/E21.521; 257/E21.525; 716/51; 716/52; 716/56

(58) Field of Classification Search .............. 257/48; 438/11, 14, 15, 18; 716/51–52, 56
See application file for complete search history.

(56) References Cited

U.S. PATENT DOCUMENTS

| 6,449,749 | B1 | 9/2002 | Stine | |
|---|---|---|---|---|
| 7,024,642 | B2 | 4/2006 | Hess et al. | |
| 7,220,990 | B2 * | 5/2007 | Aghababazadeh et al. | 257/48 |
| 2006/0101355 | A1 | 5/2006 | Ciplickas et al. | |

OTHER PUBLICATIONS

Stapper, C. H., Rosner, R. J., "Integrated Circuit Yield Management and Yield Analysis: Development and Implementation," IEEE Transactions on Semiconductor Manufacturing, pp. 95-102, vol. 8, No. 2, 1995.
Ipri, A. C., Sarace, J. C., "Integrated Circuit Process and Design Rule Evaluation Techniques," RCA Review, pp. 323-350, vol. 38, No. 3, Sep. 1977.

(Continued)

*Primary Examiner* — Dung A. Le

(57) ABSTRACT

A test chip comprises at least one level having an array of regions. Each region is capable of including at least one test structure. At least some of the regions include respective test structures. The level has a plurality of driver lines that provide input signals to the test structures. The level has a plurality of receiver lines that receive output signals from the test structures. The level has a plurality of devices for controlling current flow. Each test structure is connected to at least one of the driver lines with a first one of the devices in between. Each test structure is connected to at least one of the receiver lines with a second one of the devices in between, so that each of the test structures can be individually addressed for testing using the driver lines and receiver lines.

42 Claims, 15 Drawing Sheets

OTHER PUBLICATIONS

Buehler, M. G., "Microelectronic Test Chips for VLSI Electronics," VLSI Electronics Microstructure Science, pp. 529-576, vol. 6, Chapter 9, Academic Press, 1983.

Doong, K., Cheng, J., Hsu, C., "Design and Simulation of Addressable Failure Site Test Structure for IC Process Control Monitor," pp. 219-222, International Symposium on Semiconductor Manufacturing, 1999.

Hess, C., Weiland, L. H., "Influence of Short Circuits on Data of Contact & Via Open Circuits Determined by a Novel Weave Test Structure," IEEE Transactions on Semiconductor Manufacturing, pp. 27-34, vol. 9, No. 1, 1996.

Hess, C., Stashower, D., Stine, B. E., Weiland, L. H., Verma, G., Miyamoto, K., Inoue, K., "Fast Extraction of Defect Size Distribution Using a Single Layer Short Flow NEST Structure", IEEE Transactions on Semiconductor Manufacturing, pp. 330-337, vol. 14, No. 4, 2001.

Walton, A. J., Ward, D., Robertson, J. M., Holwill R. J., "A Novel Approach for an Electrical Vernier to Measure Mask Misalignment", pp. 950-953, 19th European Solid State Device Research Conference ESSDERC '89, Springer Verlag, 1989.

Hess, C., Stine, B. E., Weiland, L. H., Mitchell, T., Karnett, M., Gardner, K., "Passive Multiplexer Test Structure for Fast and Accurate Contact and Via Fail Rate Evaluation", pp. 163-167, Proc. International Conference on Microelectronic Test Structures (ICMTS), vol. 15, Cork (Ireland), 2002.

Walton, A. J., Gammie, W., Marrow, D., Stevenson, J. T. M., Holwill, R. J., "A Novel Approach for Reducing the Area Occupied by Contact Pads on Process Control Chips", International Conference on Microelectronic Test Structures, San Diego, (USA), 1990.

Hess, C., Weiland, L. H., Bornefeld, R., "Customized Checkerboard Test Structures to Localize Interconnection Point Defects", Proc. VLSI Multilevel Interconnection Conference (VMIC), pp. 163-168, Santa Clara (USA), 1997.

Hess, C., Weiland, L. H., "Defect Parameter Extraction in Backend Process Steps using a Multilayer Checkerboard Test Structure", Proc. International Conference on Microelectronic Test Structures (ICMTS), pp. 51-56, Nara (Japan), 1995.

Hess, C., Weiland, L. H., "Strategy to Disentangle Multiple Faults to Identify Random Defects within Test Structures", Proc. International Conference on Microelectronic Test Structures (ICMTS), pp. 141-146, Kanazawa (Japan), 1998.

Hess, C., Weiland, L. H., "Harp Test Structure to Electrically Determine Size Distributions of Killer Defects", IEEE Transactions on Semiconductor Manufacturing, pp. 194-203, vol. 11, No. 2, 1998.

Hess, C., Weiland, L. H., "Drop in Process Control Checkerboard Test Structure for Efficient Online Process Characterization and Defect Problem Debugging", Proc. International Conference on Microelectronic Test Structures (ICMTS), pp. 152-159, San Diego (USA), 1994.

Hess, C., Weiland, L. H., Lau, G., Simoneit, P., "Control of Application Specific Interconnection on Gate Arrays Using an Active Checkerboard Test Structure", Proc. International Conference on Microelectronic Test Structures (ICMTS), pp. 55-60, Trento (Italy), 1996.

Doong, K., Hsieh, S., Lin, S., Shen, B. Cheng, J., Hess, C., Weiland, L., Hsu, C., "Addressable Failure Site Test Structures (AFS-TS) for CMOS Processes: Design Guidelines, Fault Simulation, and Implementation", IEEE Transactions on Semiconductor Manufacturing, pp. 338-355, vol. 14, No. 4, 2001.

Ward, D., Walton, A. J., Gammie, W. G., Holwill, R. J., "The Use of a Digital Multiplexer to Reduce Process Control Chip Pad Count", International Conference on Microelectronic Test Structures, vol. 5, San Diego (USA), 1992.

Khare, J., Maly, W., Griep, S., Schmitt-Landsiedel, D., "SRAM-based Extraction of Defect Characteristics", International Conference on Microelectronic Test Structures, vol. 7, San Diego, USA, 1994.

* cited by examiner

100

102

104

106

200

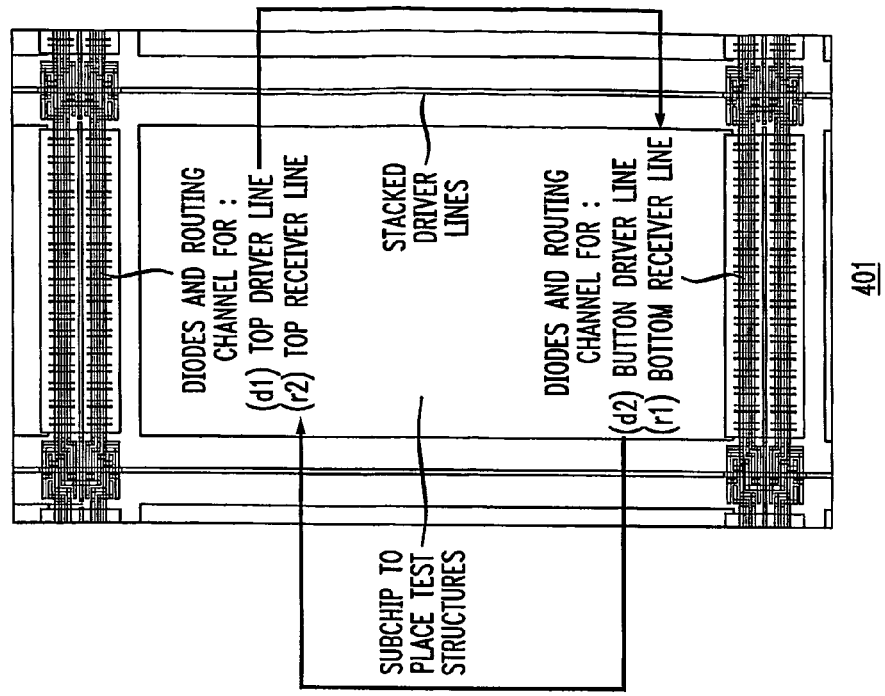
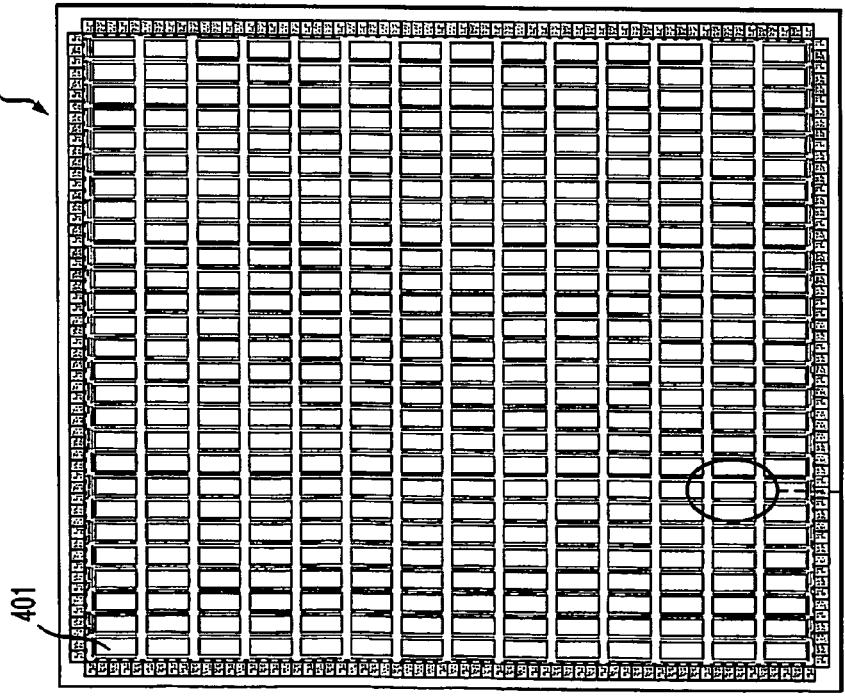

METHOD AND CONFIGURATION FOR CONNECTING TEST STRUCTURES OR LINE ARRAYS FOR MONITORING INTEGRATED CIRCUIT MANUFACTURING

This application claims the benefit of U.S. Provisional Patent Application No. 60/511,535, filed Oct. 15, 2003.

FIELD OF THE INVENTION

This invention relates to methods for measuring and evaluating the process and design related statistical variations of an integrated circuit manufacturing process in order to determine their sources and their effects on the yield and performance of the product.

BACKGROUND

Random defects (e.g. particles) can cause electrically measurable faults (killer defects), which are dependent on the chip layout as well as the layer and location of the defects. Also, certain layout geometries can cause systematic faults dependent on specific combinations of layout and manufacturing process steps. Random as well as systematic faults are responsible for manufacturing related malfunction of chips. So, investigating random and systematic faults is important for yield enhancement and to control quality of process steps and product chips, as discussed in Staper, C. H., Rosner, R. J., "Integrated Circuit Yield Management and Yield Analysis: Development and Implementation," IEEE Transactions on Semiconductor Manufacturing, pp. 95-102, Vol. 8, No. 2, 1995, which is incorporated by reference herein. Test structures are used to detect faults, to identify and localize defects, as well as to characterize systematic manufacturability of layout geometries.

Many test structures like via or contact chains, snake and comb lines etc. have been described to detect defects, e.g. in Ipri, A. C., Sarace, J. C., "Integrated Circuit Process and Design Rule Evaluation Techniques," RCA Review, pp. 323-350, Volume 38, Number 3, September 1977, and Buehler, M. G., "Microelectronic Test Chips for VLSI Electronics," VLSI Electronics Microstructure Science, pp. 529-576, Vol 9, Chapter 9, Academic Press, 1983, both of which are incorporated by reference herein. Two parallel via chains as described in Doong, K., Cheng, J., Hsu, C., "Design and Simulation of Addressable Fault Site Test Structure for IC Process Control Monitor," International Symposium on Semiconductor Manufacturing, 1999, which is incorporated herein by reference. Multiple interwoven via chains which allow for the detection of open and short circuits are described in Hess, C., Weiland, L. H., "Influence of Short Circuits on Data of Contact & Via Open Circuits Determined by a Novel Weave Test Structure," IEEE Transactions on Semiconductor Manufacturing, pp. 27-34, Vol. 9, No. 1, 1996, which is incorporated herein by reference. To characterize the density and size distribution of random defects a NEST test structure is described at Hess, C., Stashower, D., Stine, B. E., Weiland, L. H., Verma, G., Miyamoto, K., Inoue, K., "Fast Extraction of Defect Size Distribution Using a Single Layer Short Flow NEST Structure", IEEE Transactions on Semiconductor Manufacturing, pp. 330-337, Vol. 14, No. 4, 2001, which is incorporated herein by reference.

However, all those test structures are connected to individual pads for testing. Far more than 1000 differently designed test structures per layer may be required to achieve yield and performance improvements as described in detail in U.S. Pat. No. 6,449,749, entitled: System and Method for Product Yield Prediction and in U.S. Provisional Application No. 60/437,922, entitled YIELD IMPROVEMENT, filed on Jan. 2, 2003, both of which are incorporated by reference herein. It is difficult or impossible to place all those test structures on a single test chip if they are all connected to individual pads for testing, since there is not enough area to place all those pads. Methods of pad sharing are used to address and access individual test structures by significantly reducing the number of pads required for testing.

To do so, single vias have been placed in a passive array where each via is connected to a unique set of two lines as described in detail at Walton, A. J., Ward, D., Robertson, J. M., Holwill R. J., "A Novel Approach for an Electrical Vernier to Measure Mask Misalignment", 19th European Solid State Device Research Conference ESSDERC'89, Springer Verlag, 1989, which is incorporated herein by reference. But Walton et al. required that all structures (in this case a single via) are the same within such an array. If one were to place differently designed test structures within such an array, the test procedure would fail. The array also does not allow any fast digital testing.

A similar array is described by Hess, C., Stine, B. E., Weiland, L. H., Mitchell, T., Karnett, M., Gardner, K., "Passive Multiplexer Test Structure For Fast and Accurate Contact and Via Fail Rate Evaluation", Proc. International Conference on Microelectronic Test Structures (ICMTS), Cork (Ireland), 2002, which is incorporated herein by reference. It places long via chains in an array to break down the huge chain resistance for testing. Fast digital testing is possible, but again all test structures within the array had to be identical. This technique is of no help, if differently designed test structures have to be placed on a test chip.

The passive array as mentioned above can be expanded by a transistor, which is placed in serial connection to each test structure as described at Walton, A. J., Gammie, W., Marrow, D., Stevenson, J. T. M., Holwill, R. J., "A novel Approach for Reducing the Area Occupied by Contact Pads on Process Control Chips", International Conference on Microelectronic Test Structures, San Diego, (USA), 1990, which is incorporated herein by reference.

None of the methods mentioned above, allow stacking of structures in multiple layers on top of each other to efficiently make use of 10 or more routing layers that are commonly used in semiconductor manufacturing. Also, all these arrays are only able to investigate open circuit faults and are of no use if also short circuits have to be investigated. A method to permute pairs of lines has been described at Hess, C., Weiland, L. H., Bornefeld, R., "Customized Checkerboard Test Structures to Localize Interconnection Point Defects", Proc. VLSI Multilevel Interconnection Conference (VMIC), pp. 163-168, Santa Clara (USA), 1997 and Hess, C., Weiland, L. H., "Defect Parameter Extraction in Backend Process Steps using a Multilayer Checkerboard Test Structure", Proc. International Conference on Microelectronic Test Structures (ICMTS), pp. 51-56, Nara (Japan), 1995, both of which are incorporated by reference herein. Using those methods it is possible to place many test structures within a reduced number of pads to investigate short circuits. No active devices are needed, and it is possible to place multiple structures on top of each other over an unlimited number of routing layers. Unfortunately, these methods are limited to short circuits only and they have problems in disentangling multiple faults, if they occur in more than one test structures as it has been reported at Hess, C., Weiland, L. H., "Strategy to Disentangle Multiple Faults to Identify Random Defects within Test Structures", Proc. International Conference on Microelectronic Test Structures (ICMTS), pp. 141-146, Kanazawa (Japan), 1998, which is incorporated herein by reference.

A test structure has been introduced to investigate defect densities as well as defect size distributions in multiple layers as described in detail at Hess, C., Weiland, L. H., "Harp Test Structure to Electrically Determine Size Distributions of Killer Defects", IEEE Transactions on Semiconductor Manufacturing, pp. 194-203, Vol. 11, No. 2, 1998, which is incorporated herein by reference. It uses the same method of permuting pairs of lines. Even though disentangling multiple faults is rarely a concern in this case, the method still only works for short circuits.

The method of permuting lines has been combined with a diode array as being described at Hess, C., Weiland, L. H., "Drop in Process Control Checkerboard Test Structure for Efficient Online Process Characterization and Defect Problem Debugging", Proc. International Conference on Microelectronic Test Structures (ICMTS), pp. 152-159, San Diego (USA), 1994, which is incorporated herein by reference. A more advanced method has been based on transistors as it is described at Hess, C., Weiland, L. H., Lau, G., Simoneit, P., "Control of Application Specific Interconnection on Gate Arrays Using an Active Checkerboard Test Structure", Proc. International Conference on Microelectronic Test Structures (ICMTS), pp. 55-60, Trento (Italy), 1996, which is incorporated herein by reference. Even though it is now possible to evaluate open and short circuits in test structures that can be placed in multiple layers on top of each other, it is still a problem to disentangle multiple short circuit faults. This is even more of a problem if differently designed test structures are used, since some of them can fail all the time, if design rule margins are explored.

A variety of test structures are placed within shared pads using some of the methods mentioned so far can be found at Doong, K, Hsieh, S., Lin, S., Shen, B. Cheng, J., Hess, C., Weiland, L., Hsu, C., "Addressable Failure Site Test Structures (AFS-TS) for CMOS Processes: Design Guidelines, Fault Simulation, and Implementation", IEEE Transactions on Semiconductor Manufacturing, pp. 338-355, Vol. 14, No. 4, 2001, which is incorporated herein by reference. Unfortunately, there is no stacking of test structures, which is a very inefficient test chip area usage if 10 or more routing layers are available.

Multiplexer circuitry is being used to address test structures as described at Ward, D., Walton, A. J., Gammie, W. G., Holwill, R. J., "The Use of a Digital Multiplexer to Reduce Process Control Chip Pad Count", International Conference on Microelectronic Test Structures 1992, San Diego (USA), 1992, which is incorporated herein by reference. However, such test structures require that the multiplexing circuitry is working without failures. Thus, a stable working manufacturing process is required, which disqualifies this method for the early development stages of a new semiconductor manufacturing process. This technique does not allow one to apply any analog resistance and leakage measurements through the multiplexing circuitry, which is required to characterize so-called soft faults.

All those methods described above have in common that they place existing test structures like parallel lines, via chains, snake and combs, etc. in a way that reduces the number of pads for testing. But, there are significant limitations in how to use those methods, which prohibits their universal usage.

Beside using test structures, also SRAM or ROM based test chips have been developed for defect detection and process characterization as been described for instance in Khare, J., Maly, W., Griep, S., Schmitt-Landsiedel, D., "SRAM-based Extraction of Defect Characteristics", International Conference on Microelectronic Test Structures, San Diego, USA, 1999, which is incorporated herein by reference. Such test structures use decoders and similar complicated circuitry to address memory cells. Only if those logic blocks work without faults is it possible to detect faults in the memory cells. Beside that, it is difficult and sometimes impossible to assign a fault of a memory cell to a layout object in a specific layer, which is essential for process characterization and successful yield and performance improvement. Also, memory cells have a very uniform layout and neighborhood as well as a specific density of layout objects per layer, which does not necessarily reflect the geometries of random logic layout designs. Finally, this method does not allow one to apply analog resistance and leakage measurements to one specific memory cell.

More efficient methods to place test structures within a test chip are desired.

SUMMARY OF THE INVENTION

In some embodiments, a test chip comprises at least one level having an m×n array of regions, where m and n are integers. Each region is capable of including at least one test structure. At least some of the regions include respective test structures. The level has m+1 driver lines oriented in a first direction. The m+1 driver lines are connected to collectively provide input signals to all of the test structures. The level has 4n receiver lines arranged in a second direction. The 4n receiver lines are connected to collectively receive output signals from all of the test structures. The test structures are arranged and connected so that each of the structures can be individually addressed for testing using the m+1 driver lines and 4n receiver lines.

In some embodiments, a test chip comprises at least one level having an array of regions. Each region is capable of including at least one test structure. At least some of the regions include respective test structures. The level has a plurality of driver lines that provide input signals to the test structures. The level has a plurality of receiver lines that receive output signals from the test structures. The level has a plurality of devices for controlling current flow direction. Each test structure is connected to at least one of the driver lines with a first one of the devices therebetween. Each test structure is connected to at least one of the receiver lines with a second one of the devices therebetween, so that each of the test structures can be individually addressed for testing using the driver lines and receiver lines.

In some embodiments, a test chip, comprises at least one level having an array of regions with m columns and n rows, where m and n are integers. Each region is capable of including at least one test structure. At least some of the regions include respective test structures. The level has m+1 driver lines oriented in a first direction, with the m columns arranged between successive ones of the m+1 driver lines. Each test structure has two inputs connected by respective diodes, or transistors, or controlled switches to a respective two of the driver lines. The m+1 driver lines collectively provide input signals to all of the test structures. The level has 4n receiver lines oriented in a second direction. Each of the n rows is arranged between a respective first pair of the 4n receiver lines on a first side thereof and a respective second pair of the 4n receiver lines on a second side thereof. Each test structure has first and second outputs connected by respective diodes, transistors or controlled switches to respective ones of the receiver lines on the first and second side of that test structure, so that the 4n receiver lines collectively receive output signals from all of the test structures, whereby each of the structures can be individually addressed for testing.

In some embodiments, a test chip comprises at least one layer having n regions, where n an integer. Each region is capable of including at least one test structure. At least some of the regions include respective test structures, each comprising a nest of m parallel lines, where m is an integer. The at least one layer has m driver lines. The m driver lines are connected to provide input signals to the respective m parallel lines in each nest. The at least one layer has at least 2n receiver lines. The at least 2n receiver lines are connected to collectively receive output signals from all of the test structures. The test structures are arranged and connected to the m driver lines and at least 2n receiver lines so that a presence of a short or open circuit defect in any of the nests can be identified.

BRIEF DESCRIPTION OF THE DRAWINGS

FIG. 4A is a diagram of a test chip having an array of test structures.

FIG. 4B is an enlarged view of one subchip within the chip of FIG. 4A, including a layout of where the diodes are located.

DETAILED DESCRIPTION

Figure 1A:
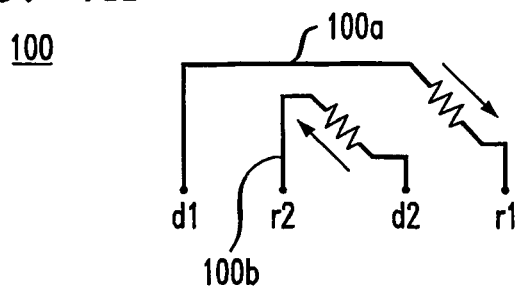
FIG. 1 shows four different types of structures that may be included in an exemplary test chip.

U.S. Provisional Patent Application No. 60/511,535, filed Oct. 15, 2003 is incorporated by reference herein in its entirety, as though fully set forth herein.

This description of the exemplary embodiments is intended to be read in connection with the accompanying drawings, which are to be considered part of the entire written description. In the description, relative terms such as "lower," "upper," "right," "left," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

To characterize multi layer semiconductor manufacturing processes it is not necessarily required to introduce or invent novel test structures to detect defects, but it is desirable to provide an efficient method to place existing or new test structures within a test chip to achieve:

- A high degree of pad sharing for most efficient use of test chip area
- Increasing the number of test structures per test chip
- Negligible impact of electronic devices used to address test structures on the ability to measure those test structures, which is preferably achieved by using single primitive devices instead of complex decoding and analog circuitry.
- An addressing logic using single primitive devices only is preferable, so that the test chip can be used even at the early development stages of a new semiconductor manufacturing process.
- The ability to individually address and access each test structure within a set of test structures using extensive pad sharing for testing
- The ability to clearly distinguish and disentangle all open AND short circuits that may occur in one test structure or more than one test structure for all test structures which are connected to shared pads for testing
- The ability to stack test structures in the third dimension on top of each other to most efficiently use test chip area
- The ability to apply analog and digital testing of test structures using extensive pad sharing for testing
- The ability for fast and accurate testing of individual test structures using extensive pad sharing for testing
- The ability for fast test and detection of open and short circuits within individual test structures using extensive pad sharing for testing
- The ability to accurately measure resistance and leakage of individual test structures using extensive pad sharing for testing
- Ability to detect hard (or "dead") short faults, where the leakage between two intentionally isolated lines is many orders of magnitude above target specification
- Ability to detect soft short faults, where the leakage between two intentionally isolated lines is for instance less than one order of magnitude above target specification.
- Ability to detect hard (or "dead") open faults, where the resistance along an intentionally connected line is many orders of magnitude above target specification.
- Ability to detect soft open faults, where the resistance along an intentionally connected line is, for instance, less than one order of magnitude above target specification.

In some embodiments of the present invention, a test chip comprises at least one level having an array of regions. Each region is capable of including at least one test structure. At least some of the regions include respective test structures. The level has a plurality of driver lines that provide input signals to the test structures. The level has a plurality of receiver lines that receive output signals from the test structures. The level has a plurality of devices for controlling current flow direction. Each test structure is connected to at least one of the driver lines with a first one of the devices therebetween. Each test structure is connected to at least one of the receiver lines with a second one of the devices therebetween, so that each of the test structures can be individually addressed for testing using the driver lines and receiver lines.

Embodiments are disclosed herein featuring a Double Diode (or Transistor or controlled switch) Array that allows the placement of individual test structures within an unlimited number of layers of a semiconductor manufacturing process in a way that allows addressing each individual test structure for fast and accurate resistance and leakage measurements including the ability to clearly assign detected hard and soft open circuits as well as hard and soft short circuits to the test structure(s) and layer(s) containing defect(s).

PCT/US02/07409, filed Mar. 12, 2002, published as WO 02/073661, (U.S. National Stage patent application Ser. No. 10/471,775, filed Sep. 12, 2003,) is incorporated by reference herein in its entirety, for its teachings on NEST configurations for reducing the number of pads.

The test chip may include commonly used simple test structures like combs, snake and combs, or via and contact chains. Usually these structures have up to 4 terminals for testing as can be seen in FIGS. 1A-1D. So for instance, FIG. 1A shows a double via/contact chain 100. For the double via/contact chain 100, a short circuit between the two chains 100a and 100b can be measured along the terminals d1 to r2, while an open circuit on one chain 100a can be measured along the terminals d1 to r1.

Figure 1B:
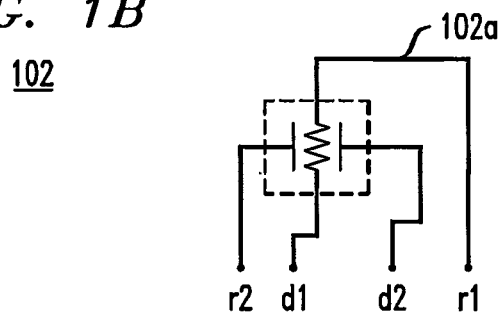

FIG. 1B shows a snake and comb structure 102. For the snake and comb structure 102, a short circuit can be measured along the terminals d1 to r2, or d2 to r1, while an open circuit in path 100a can be measured along the terminals d1 to r1.

Figure 1C:
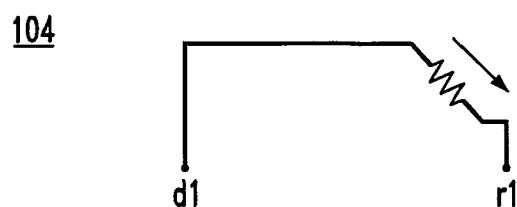
Figure 1D:
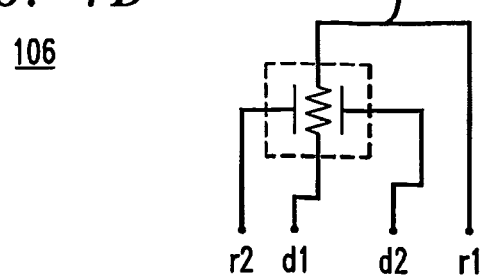

FIG. 1C shows a single via/contact chain 104. For the single via/contact chain 104, an open circuit can be measured along the terminals d1 to r1.

FIG. 1C shows a single via/contact chain 106 with a neighborhood structure. For the single chain 106 with a neighborhood structure, a short circuit between can be measured along the terminals d1 to r2, or d2 to r1, while an open circuit in path 106a can be measured along the terminals d1 to r1. Any of the structures shown in FIGS. 1A-1D may be used in a front end of line (FEOL) or back end of line (BEOL) level of the test chip.

Figure 2:
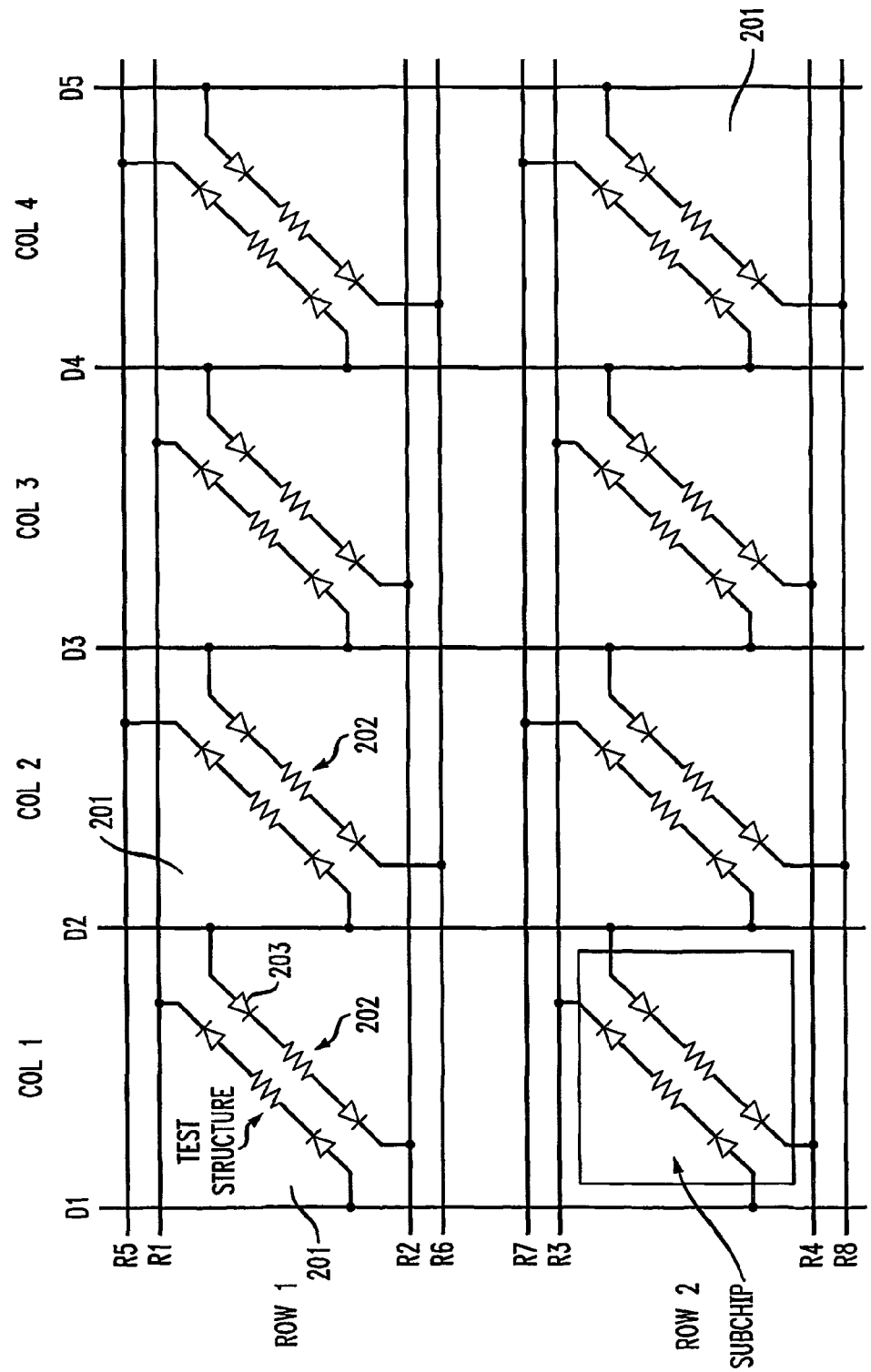
FIG. 2 is a diagram showing an array of test structures, with driver and receiver lines to individually address each test structure, in which the current direction control devices are diodes.

Embodiments are disclosed herein including test structures that will enable saving pads while still doing individual testing per test structure. For this purpose, in some embodiments, these structures are arranged in an array of rows and columns as can be seen in FIG. 2. The test chip 200 of FIG. 2 comprises at least one level having an array of regions 201 with m columns and n rows, where m and n are integers, in this case 4 columns and 2 rows, respectively. Each region 201 is capable of including at least one test structure 202. At least some of the regions 201 include respective test structures 202. The level has m+1 driver lines D1-D5 oriented in a first direction, with the m columns arranged between successive ones of the m+1 driver lines. Each test structure 202 preferably has four or fewer pins (although more than four is also contemplated), including two inputs connected by respective diodes (or transistors or controlled switches) 203 to a respective two of the driver lines. The m+1 driver lines collectively provide input signals to all of the test structures 202. The level has 4n receiver lines R1-R8 oriented in a second direction. Each of the n rows is arranged between a respective first pair of the 4n receiver lines on a first side thereof and a respective second pair of the 4n receiver lines on a second side thereof. Each test structure 202 has first and second outputs connected by respective diodes 203, transistors or controlled switches to respective ones of the receiver lines on the first and second side of that test structure, so that the 4n receiver lines collectively receive output signals from all of the test structures, whereby each of the structures can be individually addressed for testing.

For this example 8 structures 202 can be placed within 5 vertical driver lines (D1-D5) and 8 receiver lines (R1-R8). A total of 5+8 pads would be needed for testing, instead of 8*4=32 individual pads. In general, for an array or n rows and m columns of test structures such as combs, snake and combs, via and contact chains, or the like, 4n receiver lines and m+1 driver lines are used.

Figure 3:
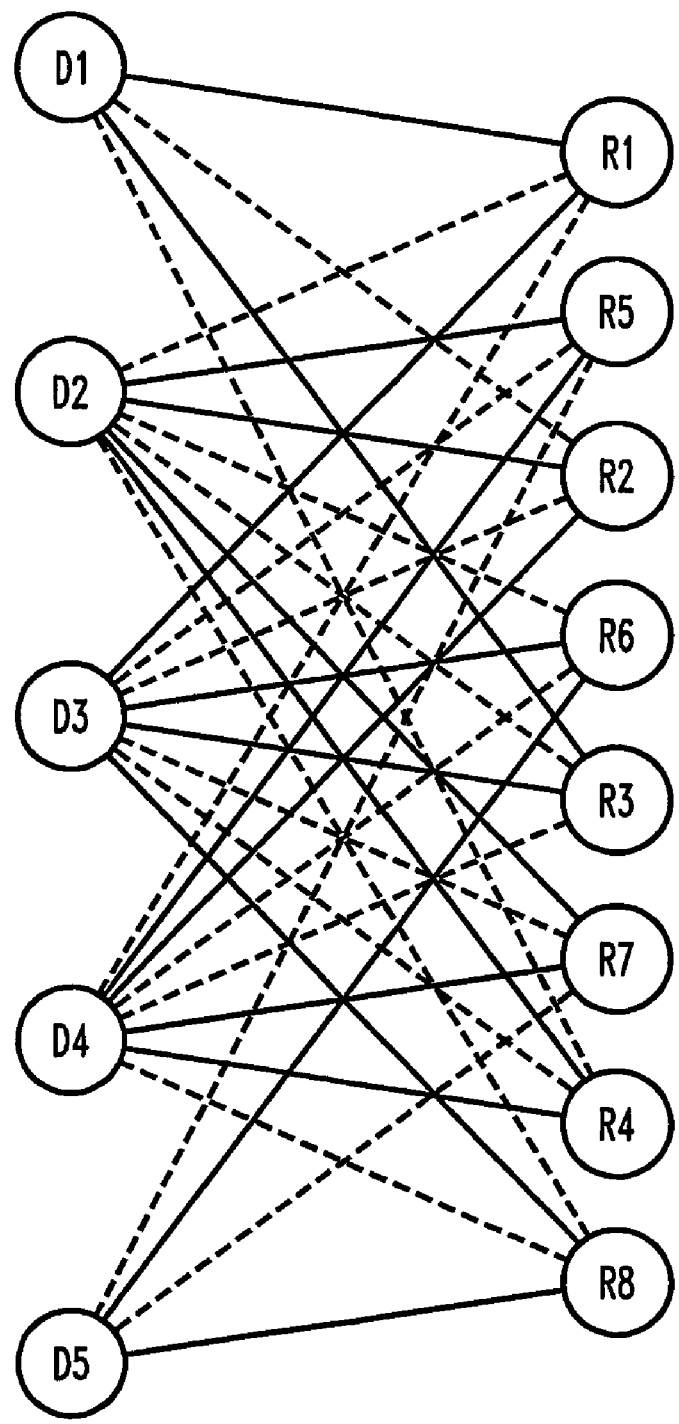
FIG. 3 is diagram showing a mapping between driver lines and receiver lines for the array of FIG. 2.

FIG. 3 is a diagram showing a mapping between the driver lines D1-D5 and the receiver lines R1-R8 in the example of FIG. 2. This example demonstrates how economy of pads is achieved by having many-to-many relationships between drivers and receivers.

To grow into the third dimension, this principle can grow with the number of layers or levels. Multiple arrays are stacked on top of each other following these rules:
Use an individual set of driver lines per stacked level.
The number of receiver lines will double if more than one level is implemented.
All even levels share one subset of receiver nodes
All odd levels share one subset of receiver nodes
So for an array of n rows, m columns and p levels, 8n receiver lines are needed and p(m+1) driver lines are needed to individually address each test structure. A larger number of lines may be used, but is not necessary. Using this concept will then allow not only to distinguish open and shorts within one level, but also open and shorts between structures placed in adjacent levels.

For example, FIG. 4A shows an array 400 having p=4 levels, n=14 rows and m=27 columns. Each region 401 defined by the intersection of a row and a column constitutes a subchip. In a multilevel chip, the subchip 401 also has multiple levels. For the example of p=4 levels, n=14 rows and m—27 columns, 378 subchips are available, each being able to hold 4 test structures. Thus a total of 1512 test structures can be placed inside this array and instead of needing 6048 pads for those (as would be required if each structure has its own separate driver and receiver lines), only 224 pads are required using this embodiment. FIG. 4B shows an exemplary arrangement of the diodes along the rows and how a test structure with 4 or less terminals is hooked up to the array of driver and receiver lines. This can also be seen in more detail in FIG. 5.

Figure 5:
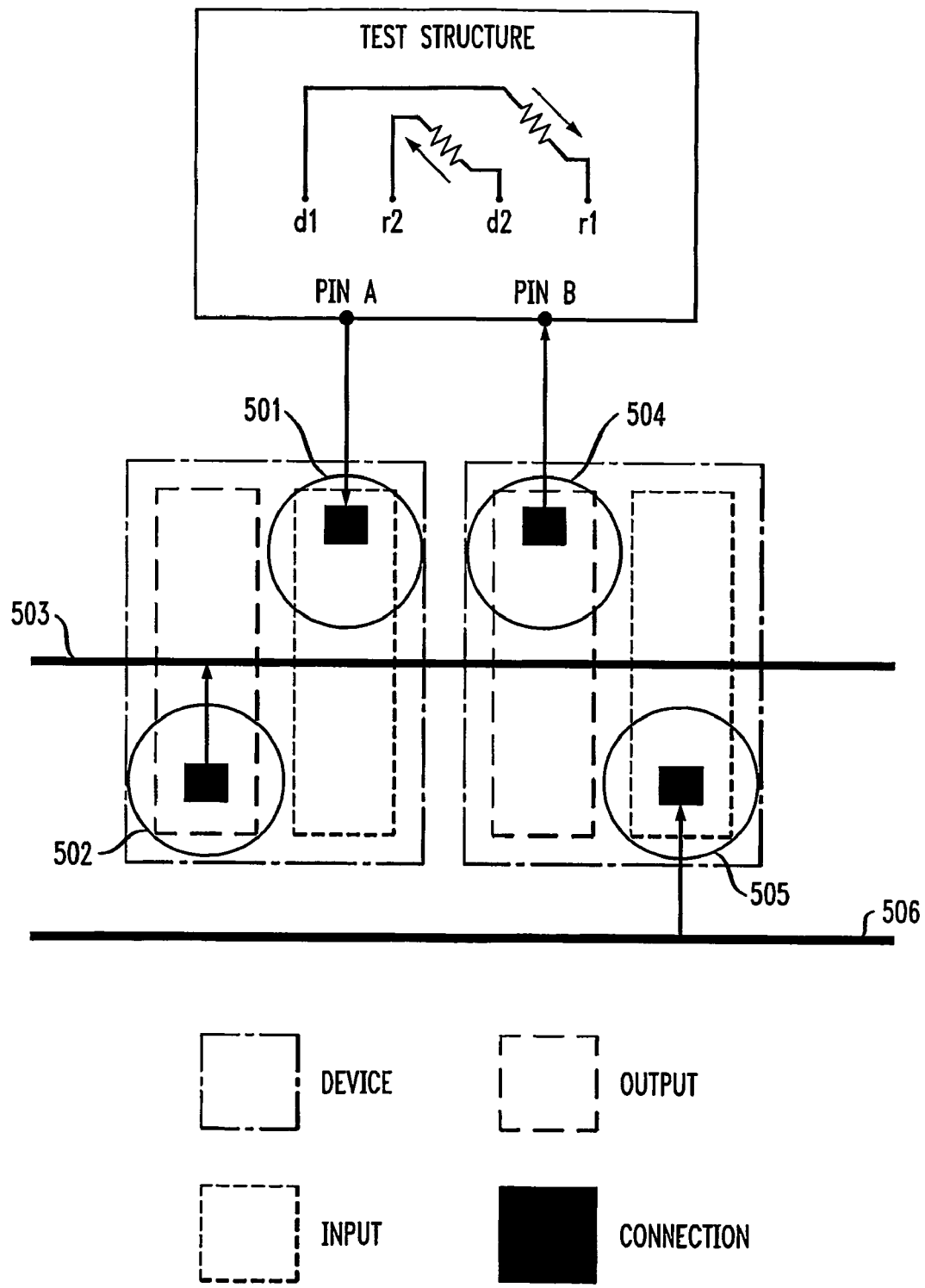
FIG. 5 is a diagram showing connections to diodes within a subchip as shown in FIG. 4B.

FIG. 5 shows an example of a stacked structure (e.g., a zigzag chain) and how two of the 4 terminals of the structure are connected to individual diodes. Note that the solid squares represent connections between levels. Item 501 represents the connection of a zig zag line to receiver diode. (ZIG ZAG lines for test vehicles are described in U.S. patent application Ser. No. 10/202,278 filed Jul. 24, 2002 (U.S. Patent Application Publication No. 20030020503 A1, which is incorporated by reference herein in its entirety). Item 502 represents the connection of a receiver diode to a receiver line. Item 503 represents 2 stacked receiver lines for even and odd levels. Item 504 represents a connection of zig zag lines to a driver diode. Item 505 represents a connection of a driver diode to a receiver line. Item 506 represents stacked driver lines (one per level).

Figure 6:
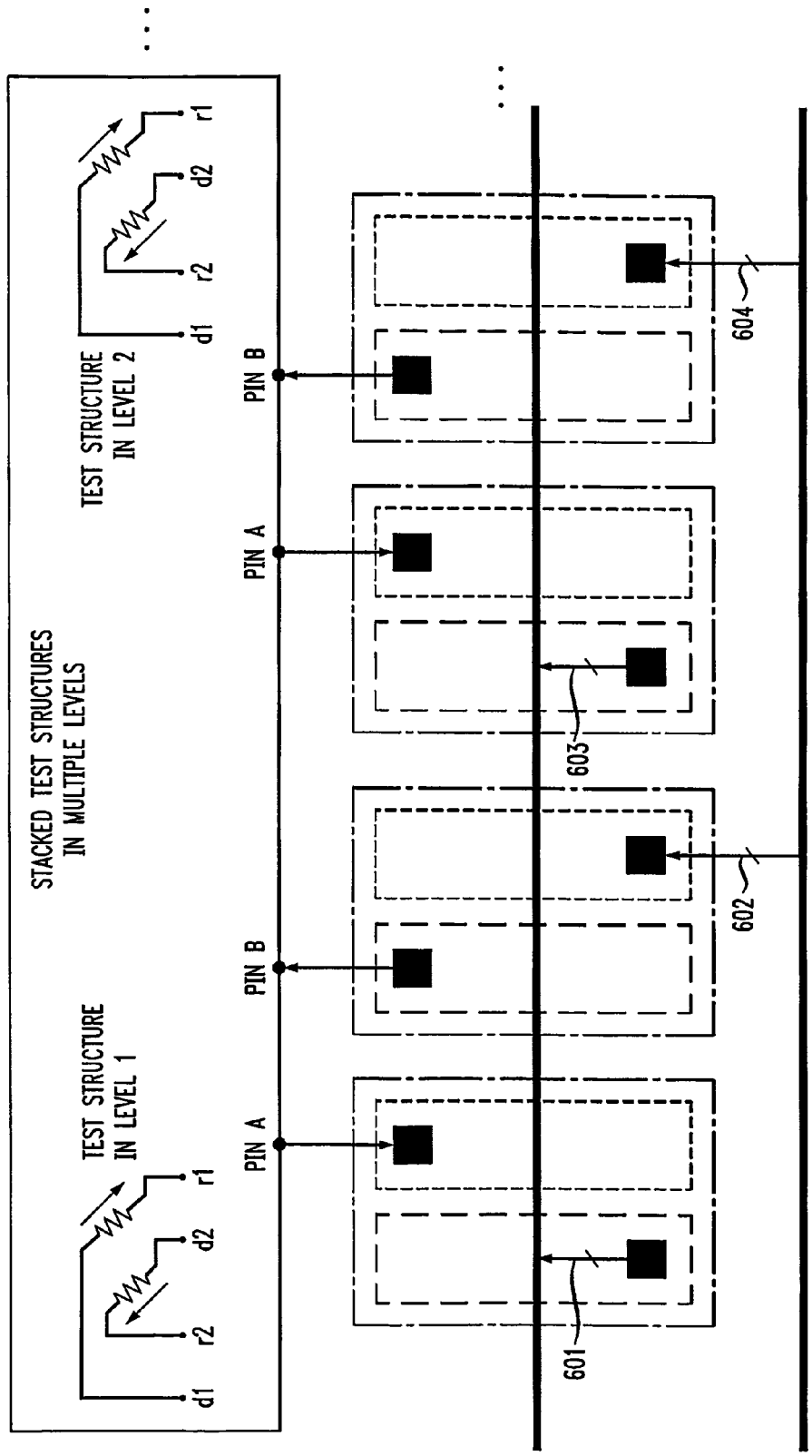
FIG. 6 is a diagram showing the connections for stacked test structures in a plurality of levels.

FIG. 6 shows in more detail, how the terminals of a test structure are connected to two diodes and then to a driver and receiver line. For a given subchip 401, the receivers for all of the odd numbered levels can be shared, and the receivers for all of the even numbered levels can be shared. Item 601 represents the receiver line for odd levels. Item 603 represents the receiver line for even levels. Item 602 represents the driver line for level 1. Item 6024 represents the driver line for level 2.

This concept of using 2 devices for controlling current direction (such as diodes, transistors or switched capacitors), one at each end of the device under test, can also be used to allow implementing multiple NEST test structures and stacking them on top of each other for defectivity characterization. This design is referred to herein as the MATRIX NEST. A NEST structure includes a plurality of parallel lines where a defect can either open lines or short lines together. Based on the number of adjacent lines being open or shorted, the defect size can be determined.

Figure 7:
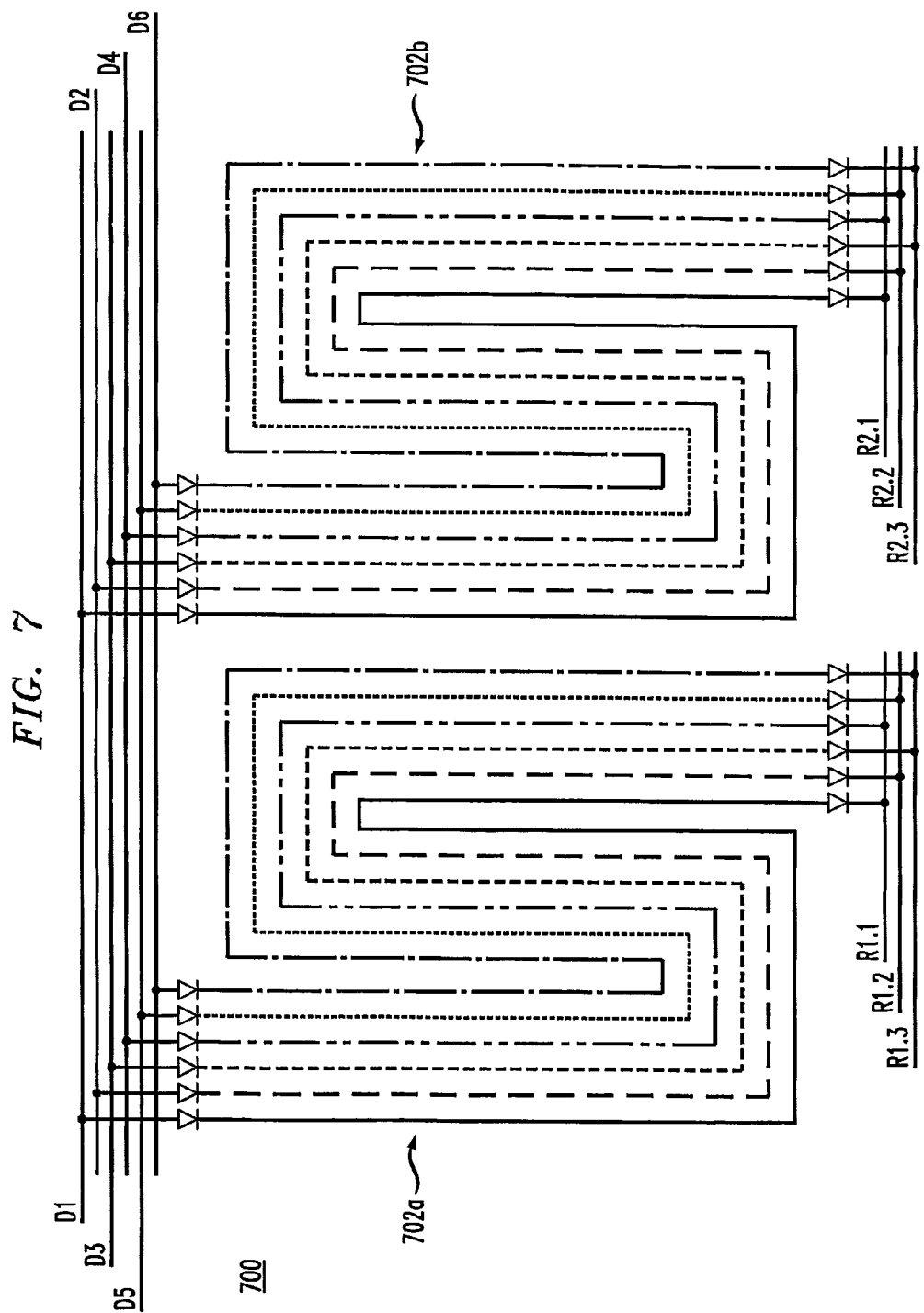
FIG. 7 is a diagram showing driver and receiver lines for a plurality of nests of parallel lines.

In FIG. 7, for example, two NEST structures 702a and 702b are shown with 6 lines each. Each NEST structure 702a, 702b corresponds to a respective region 401. The MATRIX NEST 700 is a vector (i.e., a single column of NESTs or a single row of NESTs). The driver lines D1-D6 that have formed the columns in the above-described array are now driving the parallel lines of the NESTs 702a, 702b. On the other end of the NESTs a block of three receiver lines (R1.1, R1.2, R1.3 for NEST 702a; R2.1, R2.2, R2.3 for NEST 702b) is implemented, similar to the rows of the above-described arrays. In other words, all NESTs 702 share the same driver lines D1-D6, but each NEST 702a, 702b gets its own set of 3 receiver lines. Thus it is possible to distinguish open and short circuits in a similar manner as in the previously described array. In some embodiments, as few as 2 receiver lines per NEST are used, however analysis of defects that cause opens or shorts of more than 3 lines are less complicated to resolve. This is especially true if more than 1 defect hits a single NEST structure. In general, in preferred embodiments, the number of driver lines is the same as the number of parallel lines per NEST. The number of receiver lines is preferably three times as large as the number of NESTs that are implemented within a layer. Of course, extra driver and/or receiver lines may by included, but are not required.

Figure 8B:
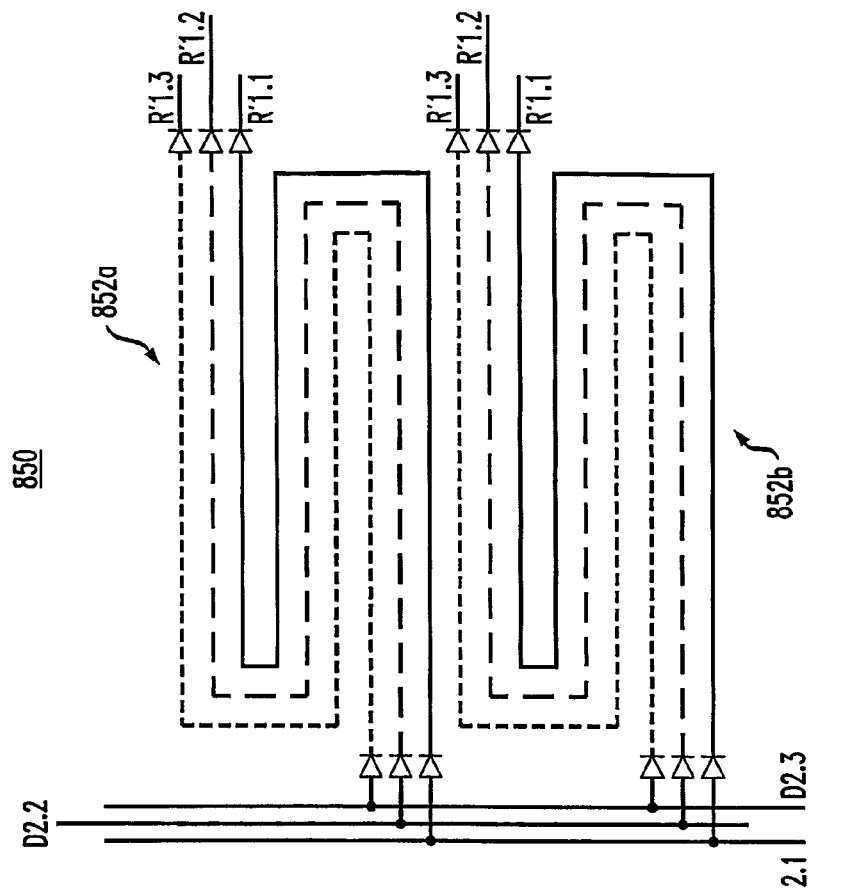
FIGS. 8A and 8B are diagrams of layouts for two layers of a subchip, wherein at least one layer is oriented vertically (FIG. 8A) and at least one layer is oriented horizontally (FIG. 8B).
Figure 8A:
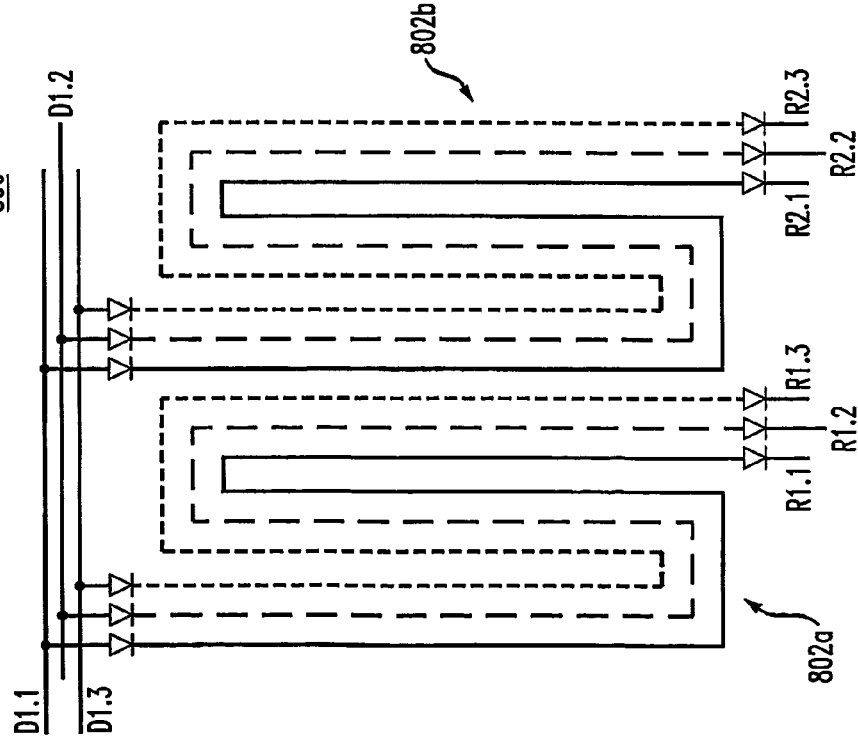
Figure 9:
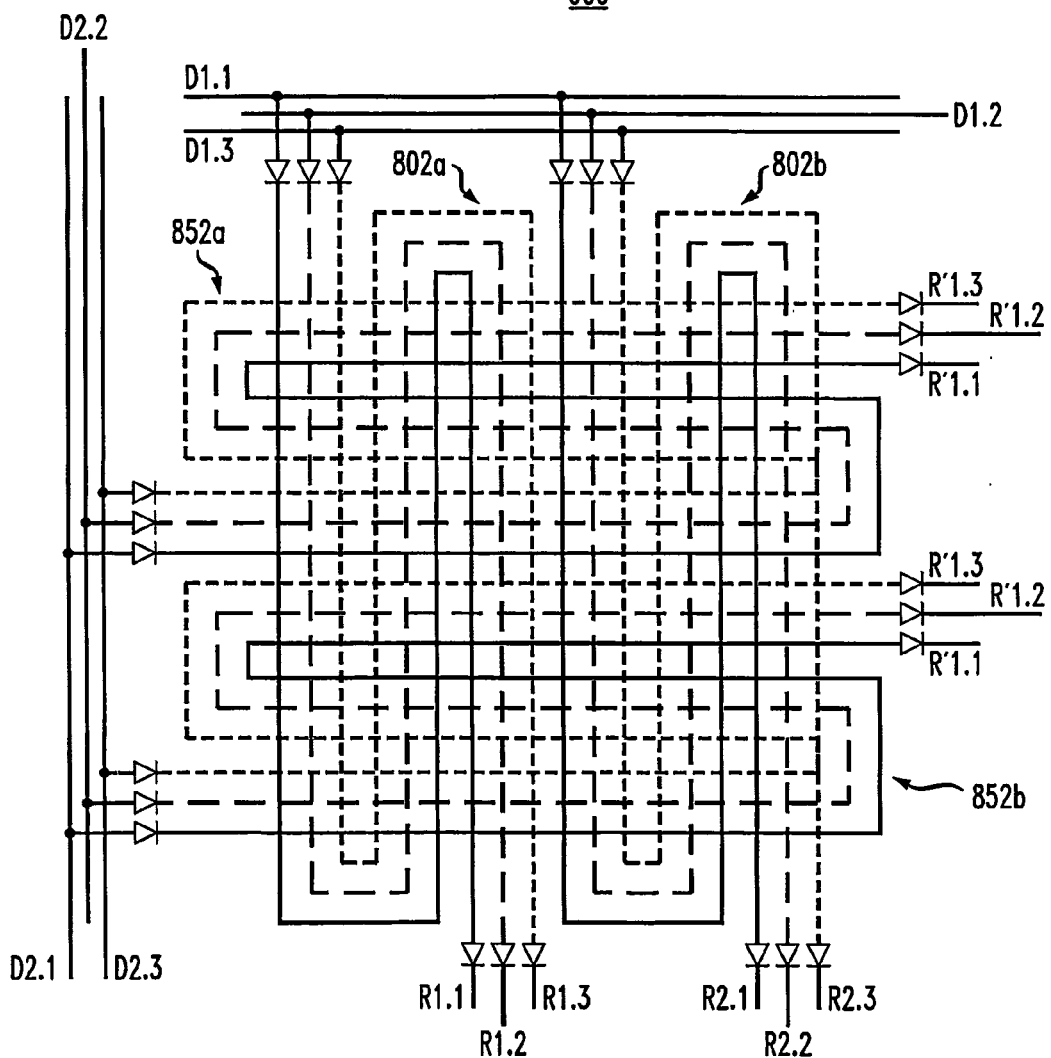
FIG. 9 is a diagram showing how the vertical and horizontal layers are stacked.

FIGS. 8A and 8B show another example of multiple single layer NESTs, this time 3 line NESTs, which are now being used to better illustrate how the MATRIX NEST concept can grow into the third dimension. FIG. 8A shows a MATRIX NEST 800 having vertically implemented NESTs 802a, 802b, where the driver lines D1.1-D1.3 are placed on the top and the receiver lines (R1.1-R1.3 for NEST 802a; R2.1-R2.3 for NEST 802b) are placed on the bottom. FIG. 8B shows a MATRIX NEST 850 having horizontally implemented NESTs 852a, 852b, where the driver lines D2.1-D2.3 are placed on the left and the receiver lines (R1.1-R1.3 for NEST 852a; R2.1-R2.3 for NEST 852b) are placed on the right. Stacking is possible by following these rules:
  Implement vertically placed NESTs in every even layer
  Implement horizontally placed NESTs in every odd layer
  Use a separate set of driver lines per layer
  Share receiver lines within all horizontally placed NESTs in all layers
  Share receiver lines within all vertically placed NESTs in all layers It is also possible to implement vertically placed NESTs 802a, 802b in every odd layer and implementing all horizontally placed NESTs 852a, 852b in every even layer. The example in FIG. 9 shows a multi-level region 900 having vertically and horizontally stacked NESTs (including NESTs 802a, 802b of FIG. 8A and NESTs 852a, 852b of FIG. 8B) for two layers.

Figure 10:
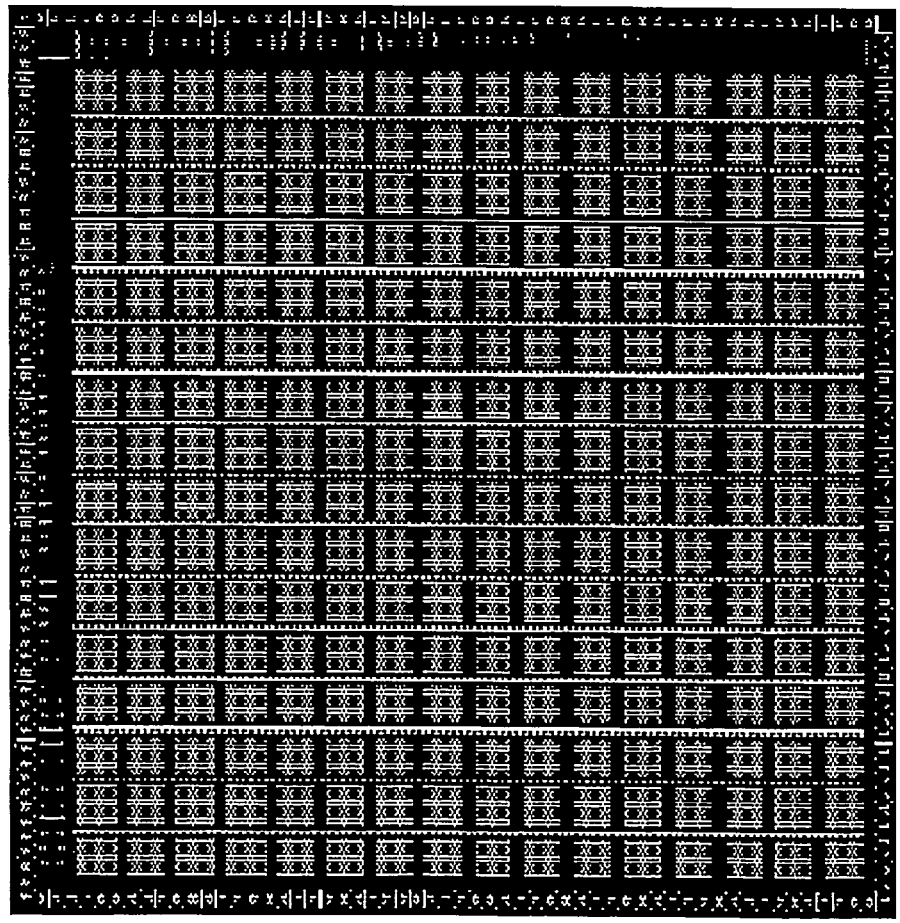
FIG. 10 is a diagram of a test chip having stacked layers of nests.

FIG. 10 shows an example where NESTs have been implemented over 8 layers, with the layers alternating between a layer of horizontal NESTs and a layer of vertical NESTs. Each thick vertical or horizontal stripe corresponds to a single nest; the individual serpentine lines of each nest are so close together that they cannot be distinguished in a drawing the size of FIG. 10. Each NEST has 12 lines, and per layer 16 NESTs (or blocks) have been implemented. So, a total of 128 NESTs have been implemented. Instead of using more than 300 pads (in a conventional configuration), only 192 pads are required using this embodiment.

Figure 16:
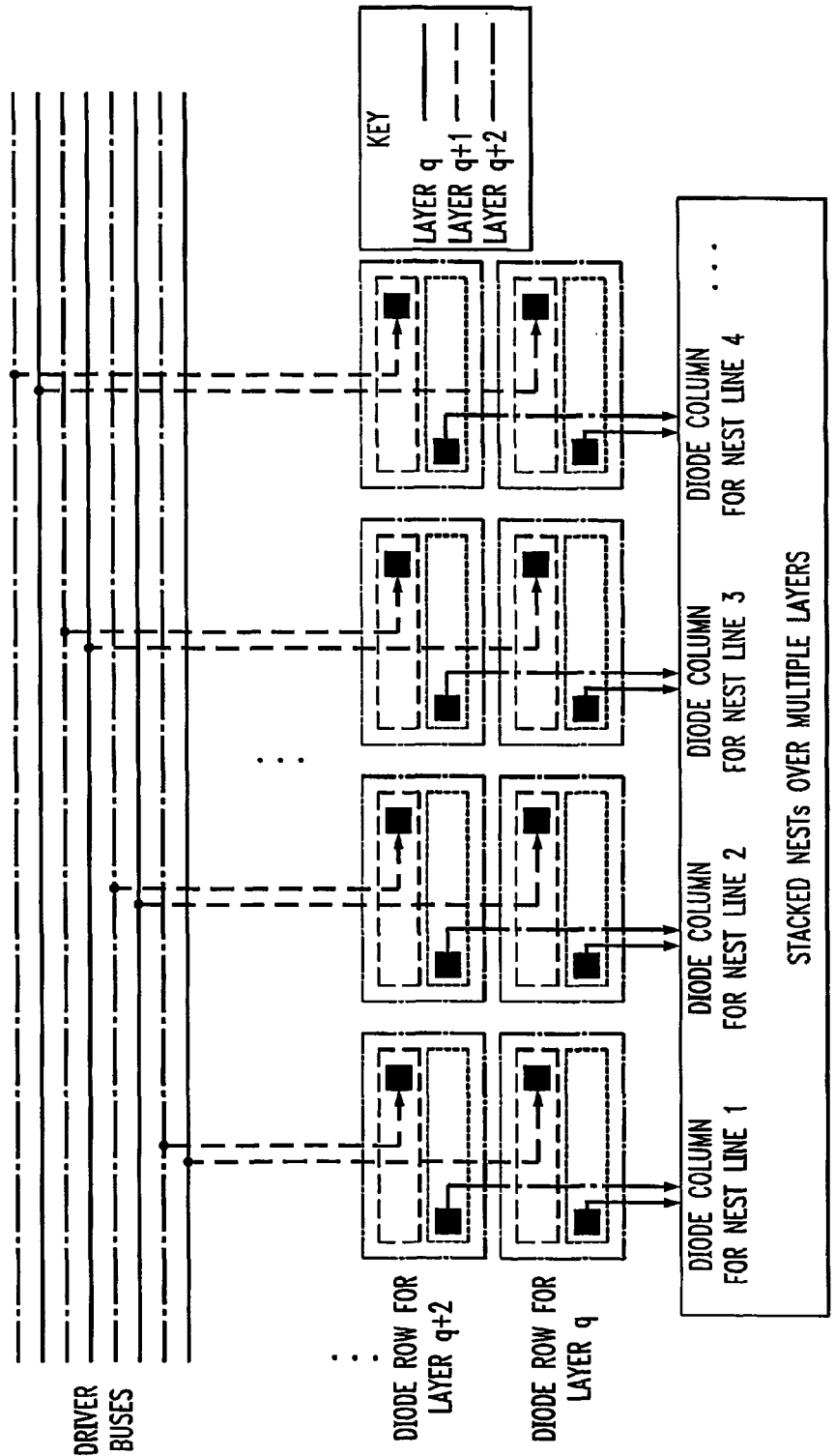
FIG. 16 is a diagram showing an exemplary routing of the nest lines through the devices to the driver lines for stacked layers of a MATRIX NEST.
Figure 17:
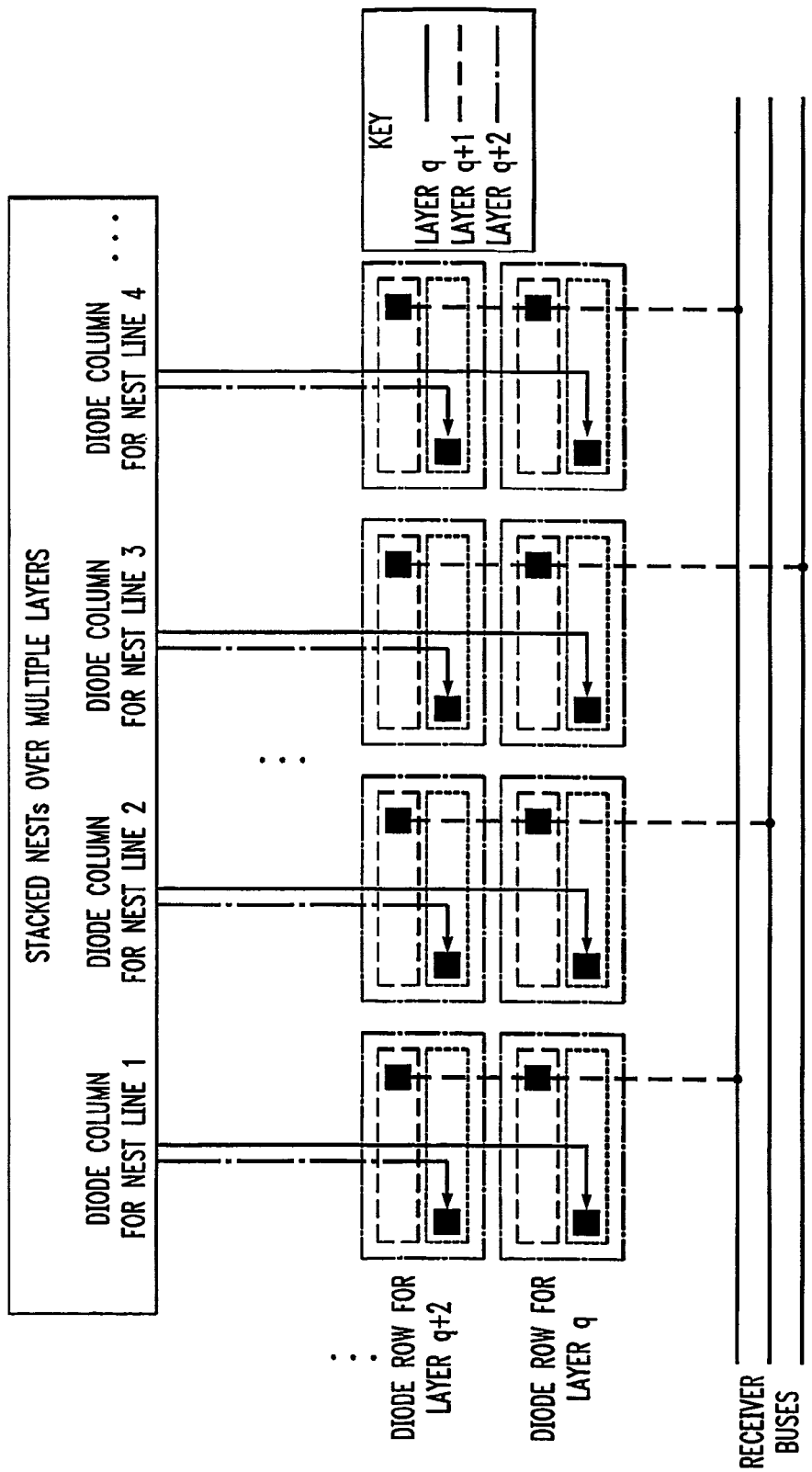
FIG. 17 is a diagram showing an exemplary routing of the nest lines through the devices to the receiver lines for one and more layers of stacked nest lines of a MATRIX NEST.

FIGS. 16-17 show a possible arrangement of the diodes, transistors or controlled switches and how the nest lines can be most efficiently routed to them. FIG. 16 shows the routing of the nest lines through the devices to the driver lines for a plurality of layers. The connections from the driver buses to the respective diode rows for layers q and q+2 are both routed through layer q+1. FIG. 17 shows the routing of the nest lines through the devices to the receiver lines for one and more layers of stacked nest lines. The connections from the receiver buses to the respective diode rows for layers q and q+2 are both routed through layer q+1. Preferably, every third line (1 and 4, 2 and 5, . . . ) from a nest share a receiver line, although it is possible to implement nests where every second line from a nest shares a receiver line. Note that in the example of FIG. 17, every third line within a given nest is shared, but receiver lines are not shared between different nests. Although FIGS. 16 and 17 only show even numbered layers, a similar routing can be used for connecting the diode rows of the odd numbered layers to the driver buses and receiver buses of the odd numbered layers.

A single test chip may include combinations of levels containing arrays of test structures and layers containing MATRIX NESTs. For levels/layers with low resistivity (e.g. BEOL layers), it is possible to use NESTs, combs, snakes, contact and via chains and the like. Where the resistivity is much higher (e.g., FEOL layers), it may not be possible to use some structures such as NESTs and long snakes and the like. The FEOL layers can include many design of experiment regions and/or layers. The DOE may, for example, vary line space, line width, doping, and the like. For a multi-level/multi-layer test chip, the test structures within any given subchip do not have to match. Each layer can include a different combination of test structures from each other layer. Although examples are shown in the figures in which every region is occupied by a test structure, some embodiments include one or more regions that do not have any test structure.

Figure 11A:
FIGS. 11A and 11B are diagrams of a pair of diodes suitable for use in an array or matrix nest as shown in FIGS. 1-10.
Figure 11B:
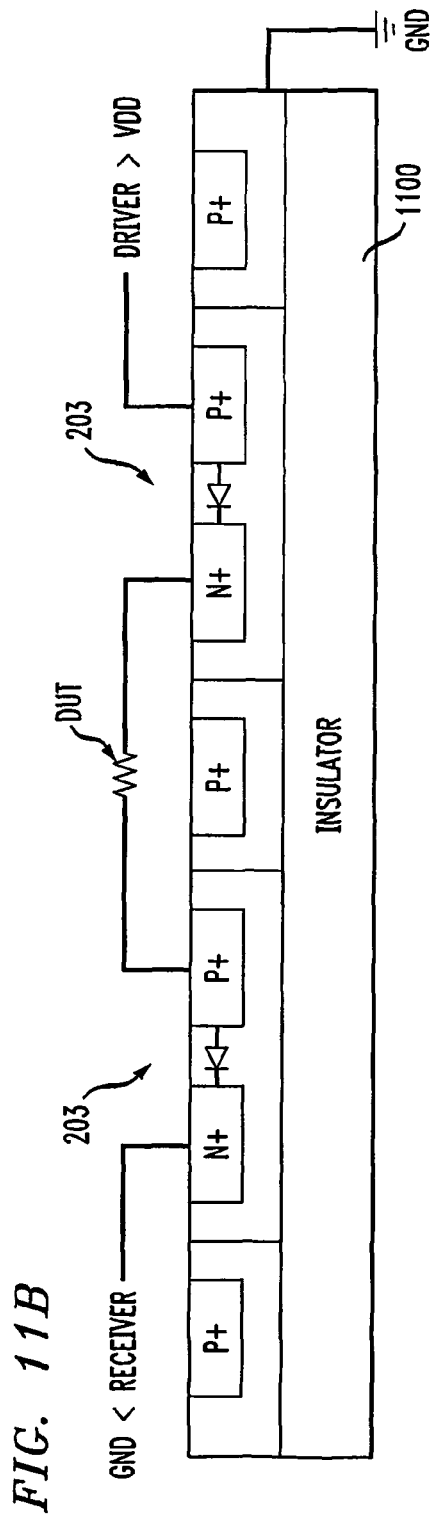
Figure 12:
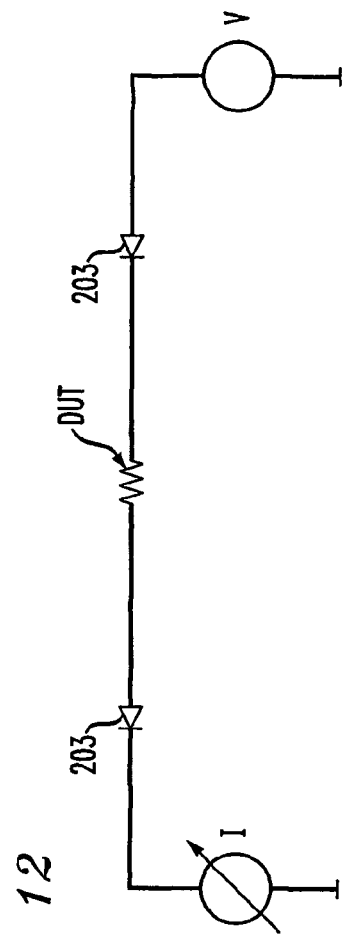
FIG. 12 is a diagram of a test method for an array or matrix nest as shown in FIGS. 1-10, using the diodes of FIG. 12.

Testing Method:

FIGS. 11A and 11B show an implementation of the diodes within an Silicon on Insulator (SOI) process. FIG. 11A is a schematic diagram, and FIG. 11B is a representative cross section of the SOI diode configuration. In this case as well as in Bipolar CMOS (BiCMOS) processes it is easily possible to build any desired number of diodes, to build the double diode array or the MATRIX NEST. Each test can be performed, by applying a voltage to one driver line, while all other driver lines are set to ground. Then the current can be measured either over all receivers in parallel or in a sequence. Then this technique will be repeated for all driver lines (ref. FIG. 12). Using the test setup of FIG. 12, the test may be performed using an inner loop in which current to GND is measured at all receivers, and an outer loop, in which a "walking 1" is applied over a sea of "0" for all drivers. Whether all receivers will be measured in parallel or in sequence depends on the variation of the resistances that are used as devices under test (DUT). If they are within a similar range, parallel testing is acceptable, since the routing resistance from the diodes to the pads do not contribute significantly. If the resistance values of the DUTs are significantly different (more than about three times difference between the smallest and largest resistance value), then testing in parallel will cause a significant voltage drop over the routing lines. Thus, testing in sequence is more accurate and certainly the preferred method of operation. Even though testing in sequence may take more time, it is practically of no significant impact. Assuming about 1-2 milliseconds per measurement, a Matrix nest with 192 pads can be tested within less than 10 seconds, which, taking into account the huge number of DUTs still shortens test time by a factor of 5-10 compared to conventional packing. Thus, beside having achieved significant pad savings and more chip area for test structures, it is also possible to test double diode arrays and MATRIX NESTs in far less time.

Although FIG. 12 shows the inner loop step of measuring current to ground at all receivers and the outer loop step of applying the walking "1" to a sea of "0" for all drivers, this order is not critical, and in other embodiments, the outer loop includes measuring current to ground at all receivers and the inner loop step of applying the walking "1" to a sea of "0" for all drivers.

Figure 13:
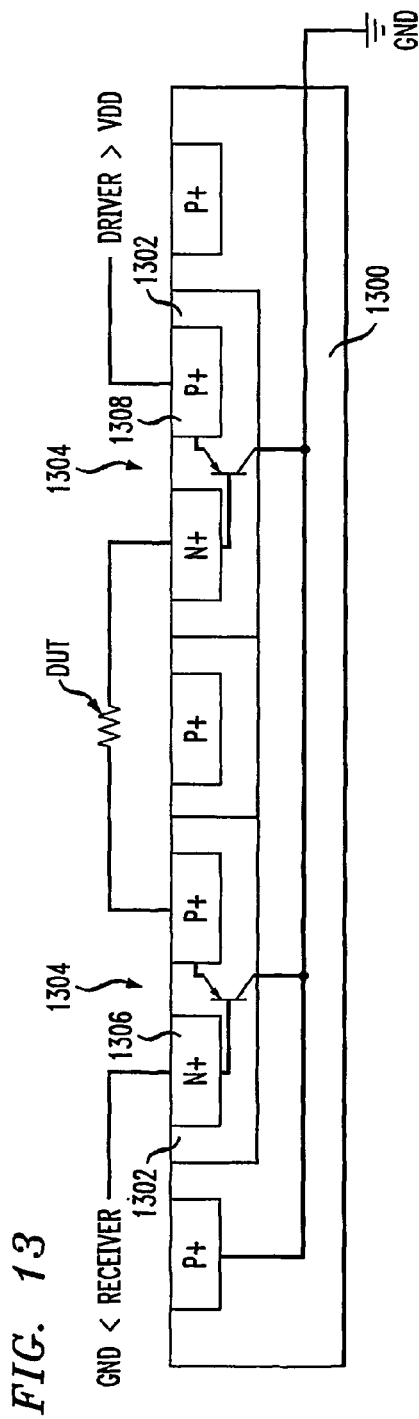
FIG. 13 is a diagram of a pair of transistors suitable for use in an array or matrix nest as shown in FIGS. 1-10.

However, a regular bulk CMOS process does not offer the usage of diodes, as can be seen in FIG. 13. Here, the n wells 1302 of each diode are connected through the common p substrate 1300. Thus, the diodes become bipolar transistors 1304, that share all collectors through the p substrate 1300. The DUT is embedded between the emitter 1306 connected to the receiver line and the base 1308 of the transistor 1304 connected to the driver line. Thus the resistance of the DUT will control the current through both transistors 1304, which is equally good for testing.

Figure 14:
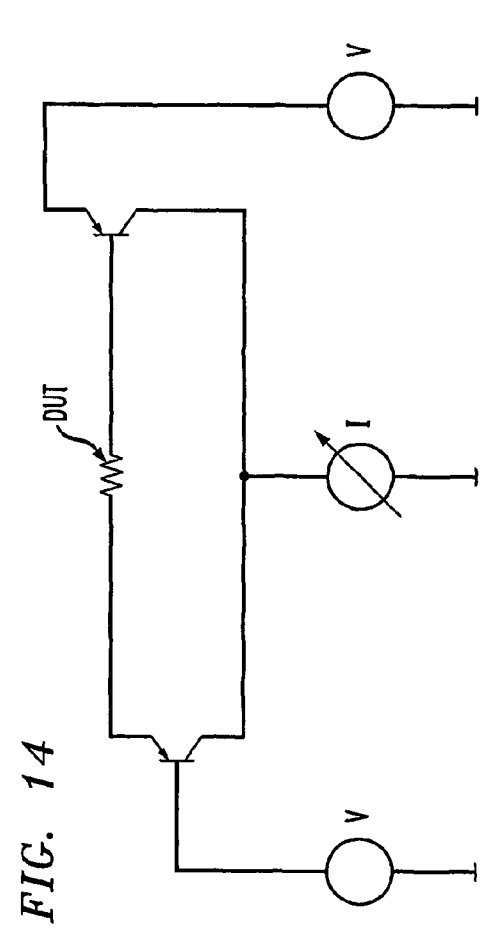
FIG. 14 is a diagram of a test method for an array or matrix nest as shown in FIGS. 1-10, using the transistors of FIG. 13.

FIG. 14 shows the measurement setup for the configuration of FIG. 13. In this case only testing in sequence is possible, since all transistors share the collectors. The current is measured from the substrate to ground. Then two loops of selecting the DUTs will be applied over the driver and receiver lines. An inner loop applies a "walking 0" over sea of "1" for all receivers. An outer loop applies a "walking 1" over sea of "0" for all drivers. The current to GND is measured at the p substrate pin for all test vectors.

By default all drivers are set to ground, while all receivers are set to a positive voltage high enough to open two base emitter diodes. Thus, all DUTs are turned off. Now the outer loop selects one driver line at a time and sets it to the high voltage, while all others stay at ground. For this setup, one receiver line is turned on by setting it to ground. After the current into substrate has been measured, the next receiver line is selected and so on. Once all receiver lines have been selected, the next driver line is chosen, and again all receivers are individually selected and so on, until all driver and receiver pairs have been measured.

Although FIG. 14 shows the inner loop of applying a "walking 0" over a sea of "1" for all receivers, and the outer loop applies a "walking 1" over a sea of "0" for all drivers, this order is not critical, and the inner and outer loops can be reversed. Thus, in some embodiments, the outer loop includes applying a "walking 0" over a sea of "1" for all receivers, and the inner loop applies a "walking 1" over a sea of "0" for all drivers, the inner and outer loops can be reversed.

Diodes can be used for controlling the direction of current in either test structure arrays (FIGS. 1-6) or MATRIX NESTS (FIGS. 7-10). Alternatively, transistors can be used for controlling the direction of current in either test structure arrays (FIGS. 1-6) or MATRIX NESTS (FIGS. 7-10). Alternatively, controlled switches can be used for selecting a specific DUT in either test structure arrays (FIGS. 1-6) or MATRIX NESTS (FIGS. 7-10).

No matter whether diodes or transistors are being used, opens and shorts can easily be detected. It is also possible to quantify relative marginality resistance changes. In general, the composite setup of n and p wells as well as substrates can also be used if all voltages are inverted. Fast application of test vectors can be achieved to use digital testers or mixed signal testers, which ensures very fast current readings below 1 millisecond.

Figure 15B:
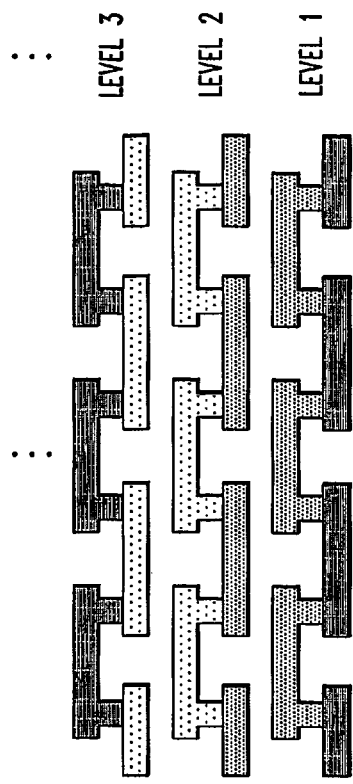
FIG. 15B is an edge elevation diagram showing the stacking of array levels in a test chip such as the chip of FIG. 4A.
Figure 15A:
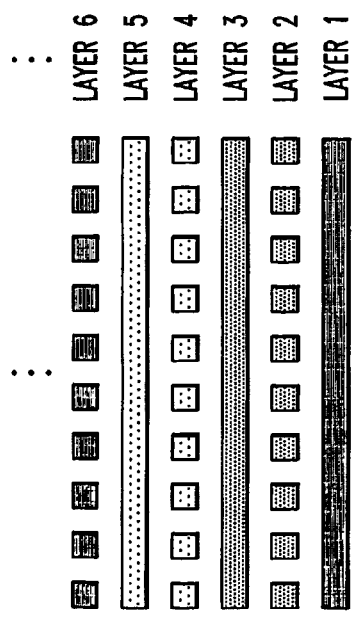
FIG. 15A is an edge elevation diagram showing the stacking of matrix nest layers in a test chip such as the chip of FIG. 10.

Summary:

FIGS. 15A and 15B summarize the stacking capabilities of the array as well as the MATRIX NEST. FIG. 15A is an edge elevation diagram showing the stacking of matrix nest layers in a test chip such as the chip of FIG. 10. FIG. 15B is an edge elevation diagram showing the stacking of array levels in a test chip such as the chip of FIG. 4A. It is important to note that there is no limitation to the number of levels within the double diode array as well as to the number of layers being implemented within a MATRIX NEST. It is also possible to pull wafers early during manufacturing, starting at the second Back End of Line (BEOL) layer and every layer thereafter. All test structures and NESTs of those layers are fully testable at that point, which decreases manufacturing time and increases the number of learning cycles to achieve rapid process improvement. Usually ten times more DUTs can be implemented within the same chip area. At the same time test time can be reduced about 5-10 times as well.

One of ordinary skill will understand that the orientation of rows and columns may either be (1) horizontal rows and vertical columns, or (2) vertical rows and horizontal columns. Thus, where a figure shows an array having n horizontal rows of m elements, an equivalent structure can be fabricated with m vertical rows of n elements.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A test chip, comprising:
   at least one level having an m×n array of regions, where m and n are integers, each region capable of including at least one test structure, at least some of the regions including respective test structures,
   the level having m+1 driver lines oriented in a first direction, the m+1 driver lines connected to collectively provide input signals to all of the test structures,
   the level having 4n receiver lines arranged in a second direction, the 4n receiver lines connected to collectively receive output signals from all of the test structures,
   wherein the test structures are arranged and connected so that each of the structures can be individually addressed for testing using the m+1 driver lines and 4n receiver lines.

2. The test chip of claim 1, wherein:
   each test structure is connected to at least one of the driver lines with a first diode, transistor or controlled switch therebetween, and
   each test structure is connected to at least one of the receiver lines with a second diode, transistor or controlled switch therebetween.

3. The test chip of claim 1, wherein:
each test structure has two inputs connected by respective diodes, transistors or controlled switches to a respective two of the driver lines, and
each test structure has two outputs connected by respective diodes, transistors or controlled switches to a respective two of the receiver lines.

4. The test chip of claim 1, wherein:
the test structures are arranged in m columns and n rows,
each column has a first one of the driver lines adjacent thereto and connected thereto on a first side thereof and a second one of the driver lines adjacent thereto and connected thereto on a second side thereof,
each row has a first pair of the receiver lines adjacent thereto and connected thereto on a first side thereof and a second pair of the receiver lines adjacent thereto and connected thereto on a second side thereof.

5. The test chip of claim 1, wherein:
the test structures are arranged in n columns and m rows,
each row has a first one of the driver lines adjacent thereto and connected thereto on a first side thereof and a second one of the driver lines adjacent thereto and connected thereto on a second side thereof,
each column has a first pair of the receiver lines adjacent thereto and connected thereto on a first side thereof and a second pair of the receiver lines adjacent thereto and connected thereto on a second side thereof.

6. The test chip of claim 1, wherein:
the test chip has p levels with test structures, where p is an integer greater than one, each of the p levels having m×n regions, at least some of the regions in each level containing test structures,
the chip has p×(m+1) driver lines, with each test structure connected to a respective at least one of the driver lines,
the chip has 8n receiver lines, with each test structure connected to a respective at least one of the receiver lines,
wherein the test structures are arranged and connected so that each of the p×(m×n) test structures can be individually addressed for testing using the p×(m+1) driver lines and 8n receiver lines.

7. The test chip of claim 6, wherein:
the p levels include odd numbered levels and even numbered levels,
each level has 4n receiver lines,
the respective commonly positioned receiver lines from each of the odd numbered levels are connected to each other, and
the respective commonly positioned receiver lines from each of the even numbered levels are connected to each other.

8. The test chip of claim 1, wherein each test structure has four or fewer pins.

9. A test chip, comprising:
at least one level having an array of regions, each region capable of including at least one test structure, at least some of the regions including respective test structures,
the level having a plurality of driver lines that provide input signals to the test structures,
the level having a plurality of receiver lines that receive output signals from the test structures,
the level having a plurality of devices for controlling current flow,
wherein each test structure is connected to at least one of the driver lines with a first one of the devices therebetween, and
each test structure is connected to at least one of the receiver lines with a second one of the devices therebetween, so that each of the test structures can be individually addressed for testing using the driver lines and receiver lines.

10. The test chip of claim 9, wherein:
each test structure has two inputs connected by respective devices to a respective two of the driver lines, and the devices are from the group consisting of diodes, transistors and controlled switches, and
each test structure has two outputs connected by respective devices to a respective two of the receiver lines, and the devices are from the group consisting of diodes, transistors and controlled switches.

11. The test chip of claim 9, wherein:
the test structures are arranged in m columns and n rows,
each column has a first one of the driver lines adjacent thereto and connected thereto on a first side thereof and a second one of the driver lines adjacent thereto and connected thereto on a second side thereof,
each row has a first pair of the receiver lines adjacent thereto and connected thereto on a first side thereof and a second pair of the receiver lines adjacent thereto and connected thereto on a second side thereof.

12. The test chip of claim 9, wherein:
the test structures are arranged in n columns and m rows,
each row has a first one of the driver lines adjacent thereto and connected thereto on a first side thereof and a second one of the driver lines adjacent thereto and connected thereto on a second side thereof,
each column has a first pair of the receiver lines adjacent thereto and connected thereto on a first side thereof and a second pair of the receiver lines adjacent thereto and connected thereto on a second side thereof.

13. The test chip of claim 9, wherein:
the test chip has p levels with test structures, where p is an integer greater than one, each of the p levels having regions, at least some of the regions in each level containing test structures, the p levels include odd numbered levels and even numbered levels,
each level has commonly positioned receiver lines,
the respective commonly positioned receiver lines from each of the odd numbered levels are connected to each other, and
the respective commonly positioned receiver lines from each of the even numbered levels are connected to each other.

14. The test chip of claim 9, wherein each test structure has four or fewer pins.

15. A test chip, comprising:
at least one level having an array of regions with m columns and n rows, where m and n are integers, each region capable of including at least one test structure, at least some of the regions including respective test structures,
the level having m+1 driver lines oriented in a first direction, with the m columns arranged between successive ones of the m+1 driver lines, each test structure having two inputs connected by respective diodes, transistors, or controlled switches to a respective two of the driver lines, the m+1 driver lines collectively providing input signals to all of the test structures,
the level having 4n receiver lines oriented in a second direction, each of the n rows arranged between a respective first pair of the 4n receiver lines on a first side thereof and a respective second pair of the 4n receiver lines on a second side thereof, each test structure having first and second outputs connected by respective diodes, transistors or controlled switches to respective ones of the receiver lines on the first and second side of that test structure, so that the 4n receiver lines collectively receive output signals from all of the test structures, whereby each of the structures can be individually addressed for testing.

16. The test chip of claim 15, wherein:

the test chip has p levels with test structures, where p is an integer greater than one, each of the p levels having m×n regions, at least some of the regions in each level containing test structures, the chip has p×(m+1) driver lines, with each test structure connected to a respective at least one of the driver lines, the chip has 8n receiver lines, with each test structure connected to a respective at least one of the receiver lines, wherein the test structures are arranged and connected so that each of the p×(m×n) test structures can be individually addressed for testing using the p×(m+1) driver lines and 8n receiver lines.

17. The test chip of claim 16, wherein:

the p levels include odd numbered levels and even numbered levels, each level has 4n receiver lines, the respective commonly positioned receiver lines from each of the odd numbered levels are connected to each other, and the respective commonly positioned receiver lines from each of the even numbered levels are connected to each other.

18. The test chip of claim 15, wherein each test structure has four or fewer pins.

19. A test chip, comprising:

at least one layer having n regions, where n an integer, each region capable of including at least one test structure, at least some of the regions including respective test structures, each comprising a nest of m parallel lines, where m is an integer, the at least one layer having m driver lines, the m driver lines connected to provide input signals to the respective m parallel lines in each nest, the at least one layer having at least 2n receiver lines, the at least 2n receiver lines connected to collectively receive output signals from all of the test structures, wherein the test structures are arranged and connected to the m driver lines and at least 2n receiver lines so that a presence of a short or open circuit defect in any of the nests can be identified.

20. The test chip of claim 19, wherein the layer has 3n receiver lines.

21. The test chip of claim 19, wherein:

the test chip has p layers, each layer having n regions, at least some of the regions in each layer including respective nests of m parallel lines, each of the p layers having m driver lines, the m driver lines connected to provide input signals to the respective m parallel lines in each nest in that respective layer, each layer having at least 2n receiver lines, the at least 2n receiver lines connected to collectively receive output signals from all of the test structures in that respective layer.

22. The test chip of claim 21, wherein the receiver lines having corresponding connections in each respective one of the odd numbered layers are connected to each other.

23. The test chip of claim 22, wherein the test structures and receiver lines in the odd numbered layers are oriented in a common direction.

24. The test chip of claim 22, wherein the receiver lines having corresponding connections in each respective one of the even numbered layers are connected to each other.

25. The test chip of claim 24, wherein:

the test structures and receiver lines in the odd numbered layers are oriented in a first common direction; and the test structures and receiver lines in the even numbered layers are oriented in a second common direction different from the first common direction.

26. The test chip of claim 19, wherein each test structure has four or fewer pins.

27. A test chip, comprising:

at least one layer having a vector of regions, each region capable of including at least one test structure, at least some of the regions including respective test structures, the layer having a plurality of driver lines that provide input signals to the test structures, the layer having a plurality of receiver lines that receive output signals from the test structures, the layer having a plurality of devices for controlling current flow, wherein each test structure is connected to at least one of the driver lines with a first one of the devices therebetween, and each test structure is connected to at least one of the receiver lines with a second one of the devices therebetween, so that each of the test structures can be individually addressed for testing using the driver lines and receiver lines.

28. A test method, comprising the steps of:

(a) forming circuit paths for at least one level of a chip, the level having an m×n array of regions, where m and n are integers, at least some of the regions including respective test structures, (b) forming m+1 driver lines oriented in a first direction, each test structure being connected to at least one of the driver lines;

(c) forming 4n receiver lines arranged in a second direction, each test structure being connected to at least one of the receiver lines;

(d) individually addressing all the test structures using the m+1 driver lines and 4n receiver lines; and (e) providing input signals to all of the test structures using the m+1 driver lines, and (f) receiving output signals from all of the test structures using the 4n receiver lines.

29. The test method of claim 28, wherein:

each test structure has two inputs connected by respective diodes, transistors or controlled switches to a respective two of the driver lines, and each test structure has two outputs connected by respective diodes, transistors or controlled switches to a respective two of the receiver lines.

30. The method of claim 28, wherein:

each test structure in the level is connected to at least one of the driver lines with a first diode therebetween, each test structure in the level is connected to at least one of the receiver lines with a second diode therebetween, step (e) includes performing as one of the group consisting of an inner loop and an outer loop a sequence of successively applying a first signal to each driver line of the level, one at a time, while applying a second signal to all remaining driver lines in the level; and step (f) includes performing as the other of the group consisting of the inner loop and the outer loop a sequence of measuring a current to ground at each receiver line of the level, wherein the inner loop is performed each time the an iteration of the outer loop is performed.

31. The method of claim 28, wherein:
each test structure in the level is connected to at least one of the driver lines with a first transistor therebetween,
each test structure in the level is connected to at least one of the receiver lines with a second transistor therebetween, and
step (e) includes performing as one of the group consisting of an inner loop and an outer loop a sequence of successively applying a first voltage to each driver line of the level, one at a time, while applying a second voltage to all remaining driver lines in the level;
step (f) includes performing as the other of the group consisting of the inner loop and the outer loop a sequence of applying the second voltage to each receiver line of the level, one at a time, while applying the first voltage to all remaining receiver lines in the level; and
the method further comprises measuring a wafer substrate current to ground each time the second voltage is applied to a different receiver line in step (e).

32. The test method of claim 28, wherein:
the chip has p levels with test structures, where p is an integer greater than one, each of the p levels having m×n regions, at least some of the regions in each level containing test structures,
the chip has p×(m+1) driver lines, with each test structure connected to a respective at least one of the driver lines,
the chip has 8n receiver lines, with each test structure connected to a respective at least one of the receiver lines, and
step (d) includes individually addressing the p×(m×n) test structures for testing using the p×(m+1) driver lines and 8n receiver lines.

33. The test method of claim 32, wherein:
the p levels include odd numbered levels and even numbered levels,
each level has 4n receiver lines,
and the method further comprises:
connecting the respective commonly positioned receiver lines from each of the odd numbered levels to each other, and
connecting the respective commonly positioned receiver lines from each of the even numbered levels to each other.

34. A test method, comprising the steps of:
(a) forming circuit paths for at least one layer having n regions, where n is an integer, each region capable of including at least one test structure, at least some of the regions including respective test structures, each comprising a nest of m parallel lines, where m is an integer,
(b) forming m driver lines for the at least one layer;
(c) forming at least 2n receiver lines for the at least one layer;
(d) providing input signals to the respective m parallel lines in each nest using the m driver lines;
(e) measuring output signals from all of the test structures using the at least 2n receiver lines; and
(f) identifying the presence of a short or open circuit defect in any of the nests based on the output signals received by way of the at least 2n receiver lines.

35. The test method of claim 34, wherein the layer has 3n receiver lines, and step (f) includes identifying the presence of a short or open circuit defect in any of the nests based on the output signals received by way of the 3n receiver lines.

36. The test method of claim 34, wherein:
the test chip has p layers, each layer having n regions, at least some of the regions in each layer including respective nests of m parallel lines,
each of the p layers having m driver lines, the m driver lines connected to provide input signals to the respective m parallel lines in each nest in that respective layer,
each layer having at least 2n receiver lines, the at least 2n receiver lines connected to collectively receive output signals from all of the test structures in that respective layer.

37. The test method of claim 36, further comprising connecting receiver lines having corresponding positions in each respective one of the odd numbered layers to each other.

38. The test method of claim 37, wherein the test structures and receiver lines in the odd numbered layers are oriented in a common direction.

39. The test method of claim 37, further comprising connecting receiver lines having corresponding positions in each respective one of the even numbered layers to each other.

40. The test method of claim 37, wherein:
the test structures and receiver lines in the odd numbered layers are oriented in a first common direction; and
the test structures and receiver lines in the even numbered layers are oriented in a second common direction different from the first common direction.

41. The test method of claim 34, wherein
each test structure in the layer is connected to at least one of the driver lines with a first transistor therebetween,
each test structure in the layer is connected to at least one of the receiver lines with a second transistor therebetween,
step (d) includes performing as one of the group consisting of an outer loop and an inner loop a sequence of successively applying a first voltage to each driver line of the layer, one at a time, while applying a second voltage to all remaining driver lines in the layer;
step (e) includes performing as the other of the group consisting of the outer loop and the inner loop a sequence of applying the second voltage to each receiver line of the layer, one at a time, while applying the first voltage to all remaining receiver lines in the layer; and
the method further comprises measuring a wafer substrate current to ground each time the second voltage is applied to a different receiver line in step (e).

42. The method of claim 34, wherein:
each test structure in the layer is connected to at least one of the driver lines with a first diode therebetween,
each test structure in the layer is connected to at least one of the receiver lines with a second diode therebetween,
and step (e) includes
performing as one of the group consisting of an inner loop and an outer loop a step of successively applying a first signal to each driver line of the level, one at a time, while applying a second signal to all remaining driver lines in the level; and
performing as the other of the group consisting of the inner loop and the outer loop a step of measuring a current to ground at each receiver line of the level.

* * * * *